United States Patent [19]

Cohen

[11] Patent Number: 5,258,643
[45] Date of Patent: Nov. 2, 1993

[54] ELECTRICALLY PROGRAMMABLE LINK STRUCTURES AND METHODS OF MAKING SAME

[75] Inventor: Simon S. Cohen, Burlington, Mass.

[73] Assignee: Massachusetts Institute of Technology, Cambridge, Mass.

[21] Appl. No.: 735,427

[22] Filed: Jul. 25, 1991

[51] Int. Cl.$^5$ .................. H01L 29/34; H01L 29/46; H01L 29/54; H01L 23/48
[52] U.S. Cl. .................. 257/530; 257/637; 257/640; 257/649; 257/750; 257/763
[58] Field of Search .................. 357/51, 67, 71; 257/530, 637, 640, 649, 750, 763

[56] References Cited

U.S. PATENT DOCUMENTS

| | | | |
|---|---|---|---|
| 4,424,578 | 1/1984 | Miyamoto | 357/51 |
| 4,458,297 | 7/1984 | Stopper et al. | 361/403 |
| 4,543,594 | 9/1985 | Mohsen et al. | 357/51 |
| 4,585,490 | 4/1986 | Raffel et al. | 148/1.5 |
| 4,748,490 | 5/1988 | Hollingsworth | 357/51 |
| 4,758,745 | 7/1988 | El Gamal et al. | 307/465 |
| 4,823,181 | 4/1989 | Mohsen et al. | 357/51 |
| 4,843,034 | 7/1989 | Herndon et al. | 437/189 |
| 4,847,732 | 7/1989 | Stopper et al. | 361/395 |
| 4,876,220 | 10/1989 | Mohsen et al. | 437/170 |
| 4,881,114 | 11/1989 | Mohsen et al. | 357/54 |
| 4,899,205 | 2/1990 | Hamdy et al. | 357/51 |
| 4,910,417 | 3/1990 | El Gamal et al. | 387/468 |
| 4,943,538 | 7/1990 | Mohsen et al. | 437/52 |
| 5,070,384 | 12/1991 | McCollum et al. | 357/51 |
| 5,087,589 | 2/1992 | Chapman et al. | 357/51 |

FOREIGN PATENT DOCUMENTS

| | | |
|---|---|---|
| 0250078 | 12/1987 | European Pat. Off. . |
| 0416903A2 | 5/1990 | European Pat. Off. . |
| 0414361A2 | 2/1991 | European Pat. Off. . |

OTHER PUBLICATIONS

B. Cook et al., "Amorphous silicon antifuse Technology for bipolar PROMS", *1986 Bipolar Circuits and Technology Meeting*, pp. 99–100.

Y. Pauleau, "Interconnect Materials For VLSI Circuits," *Solid State Technology*, vol. 30, No. 4, Apr. 1987, pp. 155–162.

International Search Report.

El-Ayat et al., *a CMOS Electrically Configurable Gate Array*, IEEE Journal, vol. 24, No. 3, Solid-State Circuits, pp. 752–761 (1989).

Mansfeld et al., *Development of "Stainless Aluminum"*, Electrochem. Soc. vol. 138, No. 12 (Dec. 1991).

Chiang et al., *Oxide-Nitride-Oxide Antifuse Reliability*, (1990) IEEE, I.R.P. Symp. 186–192.

Herndon et al., *Multilevel Internconnect Planarization by Voltage and Laser Programmable Links Using Ion Implantation* (1989) IEEE VLSI Multilevel Interconnection Conf. 322. pp. 322–324,326, FIGS. 1–7.

Kikkawa et al., *Comparison of Refractory Metal and Silicide Capping Effects on Aluminum Metallizations*, VMIC Cong. 463 (1989). pp. 463–469.

(List continued on next page.)

*Primary Examiner*—J. Carroll
*Attorney, Agent, or Firm*—Hamilton, Brook, Smith & Reynolds

[57] ABSTRACT

Methods and systems are disclosed for fabricating electrically programmable link structures by fabricating a first conductor, which comprises a refractory conductive material, then fabricating an insulative link material over the refractory conductive material and, subsequently, depositing an upper conductive material over the link material. In use, an electrical path can be formed between the first and second conductive elements by applying a voltage between such elements across at least one selected region of the insulator, such that the insulative link material is transformed in the region and rendered conductive to form an electrical signal path. The link material is preferably a silicon oxide insulator and can also include one or more protective barrier layers to physically separate the oxide from the upper and lower conductive elements. Nitrides are particularly useful as protective barrier layers.

36 Claims, 3 Drawing Sheets

OTHER PUBLICATIONS

Hamdy et al., *Dielectric Based Antifuse for Logic and Memory ICs,* 88 IEEE Int'l Electronic Device Meeting 786 (1988). pp. 786–789.

Brown et al., *Reduction of Hillock Growth on Aluminum Alloys,* Proceedings Fourth Int'l IEEE VLSI Multilevel Interconnection Conf. 426–433 (1987).

Shen et al., *A Highly Reliable Aluminum Metallization For Micron and Submicron VLSI Applications,* (Jun. 9–10, 1986) V-MIC Conf. pp. 191–197.

Gardner et al., *Layered and Homogeneous Films of Aluminum and Aluminum/Silicon with Titanium, Zirconium, and Tungsten for Multilevel Interconnects,* 84 IEDM (1984), pp. 114–117.

Stopper, *Session XVIII: Modeling and Technology,* 1985 Int'l Solid-State Circuits Conf. 268–9.

Norman G. Einspruch et al., "VLSI Electronics Microstructure Science," vol. 15, VLSI Metallization, Academic Press, Inc., 1987, pp. 274–305.

Simon S. Cohen et al., "VLSI Electronics Microstructure Science," vol. 13, Metal–Semiconductor Contacts and Devices, Academic Press, Inc., 1986, pp. 254–261.

10 μm

1 μm

ELECTRICALLY PROGRAMMABLE LINK STRUCTURES AND METHODS OF MAKING SAME

The U.S. Government has rights in this invention pursuant to Contract No. F19628-90-C-0002 awarded by the Department of the Air Force.

BACKGROUND OF THE INVENTION

The technical field of this invention is solid state integrated circuit fabrication and, more particularly, methods for fabricating voltage programmable link structures.

Programmable conductive paths, particularly "links" between two or more distinct metallization layers, are increasingly employed in solid-state integrated circuit fabrication to produce a wide variety of programmable circuits including, for example, programmable read only memories ("PROMs"), and other programmable electronic devices.

Most typically, such devices are "programmed" by the application of an electrical voltage to trigger an "antifuse" link structure disposed between two metallization layers and thereby establish an electrical connection across a region of the device which had previously been an insulator.

While this approach should in theory permit an almost limitless variety of custom circuits, certain factors make programmable devices difficult to implement. Some antifuse link structures rely upon crude melting mechanisms that require the dedication of large surface areas on the wafer to insure an electrical connection is formed.

In addition, there is an inherent tension between the desire for a link structure that will remain insulative at normal operating voltages for the solid state device (e.g., nominally five volts), and the desire that a conductive path can be reliably formed on each and every occasion by the application of a higher programming voltage (e.g., about ten volts).

If a link structure breaks down at a voltage below the "programming" or activation voltage, an unintended altered circuit will result, thereby disturbing the normal operation of the existing circuit. On the other hand, if the programmable link is over-resistant to the programming voltage, either the conductive path will not be formed when desired or greater voltages must be applied with the attendant risk of damage to nearby structures on the wafer.

Various programmable link structures have been proposed as alternatives to the crude structures which merely rely on melting or fusion processes. For example, the use of vertical holes ("vias") filled with amorphous silicon or doped silicon compositions have been disclosed in U.S. Pat. No. 4,847,732 issued to Stopper et al. and in European Patent Application Pub. No. 416,903 by Whitten et al. In this approach, a programming voltage of about 10 volts or more is used to locally heat the amorphous silicon, and thereby convert it into a conductive polycrystalline structure.

Unfortunately, amorphous silicon-based and polysilicon-based link structures have a number of disadvantages, including the limited conductivity of polysilicon, the potential presence of leakage currents through the amorphous materials even prior to activation which can lead to inadvertent breakdown, and the need for large area structures to maximize the conductivity after the link has been activated.

Another approach which has been proposed is the use of composite or sandwich structures of silicon oxide-silicon nitride-silicon oxide as the link material. When such a sandwich composite is deposited in a via, contacting a first (lower) conductive layer and then covered by a second (upper) conductive layer, it can be rendered conductive by application of a programming voltage (e.g., a pulse of about 18 volts at a current of about 1.0 mA for a time duration of about 100 msec).

A typical sandwich structure of this type is disclosed in U.S. Pat. No. 4,823,181 in which a bottom oxide layer of about 2-5 nanometers, a central silicon nitride layer of 4-10 nanometers, and a top oxide layer of 0-5 nanometers are described. Although this sandwich structure is relatively easy to fabricate (because the lower oxide layer can be thermally grown when the underlying conductor is polysilicon), these link devices also suffer a number of shortcomings in use.

The oxide-nitride-oxide compositions are poorly compatible with aluminum due to chemical reactivity and thermal effects. Aluminum readily reacts with silicon dioxide over time to form aluminum oxide and aluminum silicon complexes which can degrade the integrity of the link structure. Additionally, during wafer processing, sintering and other heating processes cause aluminum to expand more rapidly than the link composition, which applies thermal stress to the insulative oxide component of the link and can result in microfractures which facilitate premature breakdown. For these reasons, prior art sandwich link structures typically are used to form vertical conductive paths only between different layers of polysilicon lines. Polysilicon is typically a less desirable choice for conductive lines because its electrical resistance is about three orders of magnitude higher than most metals, causing signals to slow down and/or limiting the number of links that can be used in a given cell or chip.

Moreover, due to the thinness of the sandwich structures described in U.S. Pat. No. 4,823,181, they are particularly sensitive to the problems of reliability and consistency in usage. Thin oxide-nitride-oxide sandwich structures are prone to premature breakdown, while thicker structures can require high voltages (i.e. over 15 volts) with significant deviation in the actual breakdown voltage necessary from one link to another. Such high programming voltages can trigger parasitic responses and reactions in field devices and, hence, should be avoided.

There exists a need for more reliable programmable link structures, particularly structures which are voltage programmable at a nominal voltage of about ten volts, while providing stable insulation without breakdown at the normal operating voltage of about 5.0 volts.

SUMMARY OF THE INVENTION

Methods and systems are disclosed for fabricating electrically programmable link structures by fabricating a first conductor, which comprises a refractory conductive material, then fabricating an insulative link material over the refractory conductive material and, subsequently, depositing an upper conductive material over the link material. In use, an electrical path can be formed between the first and second conductive elements by applying a voltage between such elements across at least one selected region of the insulator, such that the insulative link material is transformed in the region and rendered conductive to form an electrical signal path.

The present invention provides reliable link structures that can be consistently programmed by the application of programming voltages of about 10 volts or less, with a current of about 10 microamps or less, over a time of about 1 millisecond or less. These programming parameters are a significant improvement over prior art techniques and substantially reduce the possibility of damage to adjacent device structures during programming.

In one embodiment, the first (lower) conductive element is a refractory metal, refractory metal alloy or refractory metal silicide. The refractory conductive material should have a low thermal coefficient of expansion, for example, below $10.0 \times 10^{-6}/°C.$, preferably below $7.0 \times 10^{-6}/°C.$ and most preferably under $5.0 \times 10^{-6}/°C.$ By employing a refractory conductive material having a low thermal expansion coefficient, the metallization layer can be more closely matched thermally to the underlying substrate and/or devices therein which will typically be silicon-based materials.

Particularly useful refractory conductive materials include molybdenum or molybdenum alloys which typically have a thermal expansion coefficient of about $4.0 \times 10^{-6}/°C.$ (a value that matches silicon's coefficient, nominally $3.0 \times 10^{-6}°C.$, quite well).

In contrast to molybdenum, non-refractory materials such as aluminum or aluminum alloys, should not be used to form the first (lower) conductive element because of their high thermal expansion coefficients, often about $25.0 \times 10^{-6}/°C.$ or greater. When aluminum is used alone as the lower conductive material, its thermal expansion during the various wafer processing and device fabrication that follow can cause microfractures in the link material, resulting in premature breakdowns, inadvertent breakdowns and a wide variation in the voltage needed to program individual link structures from one site to another on a wafer.

Moreover, aluminum has a tendency to form rather marked surface irregularities in the form of "hillocks" and the like, during sintering and other device processing steps. These hillocks can pierce or otherwise damage overlying insulator layers unless such insulator layers are rather thick (e.g. greater than 50 nanometers).

The use of refractory materials, such as molybdenum, its alloys and compounds, is also preferred because of the relatively smooth surfaces that can be achieved with such metallization layers. In particular, molybdenum has a tendency to form columnar microcrystals which grow vertically and cap the surface of the metallization layer with a slightly coarse, but nonetheless, smooth and regular surface morphology.

Because the refractory conductive materials disclosed herein substantially match the thermal expansion characteristics of the link materials, the likelihood of detrimental thermal stresses, microfractures, etc. is greatly reduced. In addition, the smooth surface topography of the refractory conductive materials in the present invention reduces the chance that projections from the metal layer can pierce or otherwise damage the adjacent link material, and thereby permits thinner links to be used. As a consequence, the link structures of the present invention can be programmed by application of a substantially uniform threshold voltage with little deviation from one link to another in use.

In one preferred embodiment of the invention, the lower refractory conductive material should maintain a smooth upper surface throughout processing, that is, a surface defined by the substantial absence of hillocks and other projections greater that about 10 nanometers above the nominal plane of the surface, and more preferably defined by the absence of hillocks and the like greater than about 5 nanometers in height.

The lower conductive material which serves as part of a lower metallization or interconnect layer will typically range from about 300 to about 1,000 nanometers in thickness. The conductive layer can be entirely composed of a refractory material or it may be a composite, for example, the lower portion can be a conventional conductor such as aluminum so long as it is capped with a sufficient thickness of a refractory conductive material. Up to about 80 percent of the conductive line can be aluminum so long as it is capped with about 100 nanometers or more of refractory conductive material.

It should be noted that some refractory conductive materials useful in the present invention can have a surface topography, as deposited, that is slightly coarse (e.g. with grains that may vary in height from one to another by about 1 to 5 nanometers) due to the vertical columnar structures that are typically present in molybdenum and similar materials, as initially formed. Such surface irregularities do not appear to effect the performance of link structures and, in fact, may be advantageous since the columnar structures appear to interlock and prevent the subsequent formation of hillocks during device processing.

In some applications it may be desirable to remove this slight initial surface coarseness by overcoating the refractory conductive material with another conductor such as aluminum, or another ductile metal or metal alloy, or silicon. For example, when molybdenum is used as the lower conductive element, an overcoating (e.g. about 10 to about 100 nanometers in thickness) of aluminum or silicon can be deposited thereon. When nonrefractory overcoatings of minimal thickness are used, as described above, they are too thin to cause hillocks or other potentially-damaging surface phenomena.

Once the refractory conductive layer is deposited, it is overlayed with a link material at each programmable link site. The link material is preferably a silicon oxide insulator and can also include one or more protective barrier layers to physically separate the oxide from the upper and lower conductive elements. Nitrides are particularly useful as protective barrier layers in separating the oxide layer from aluminum based metallization. Although nitrides are prone to electrical leakage, they need not contribute to the insulation in the present invention but rather serve to protect the oxide layer from chemical and/or structural damage.

In one preferred embodiment, a three part structure can be employed comprising a silicon nitride-silicon oxide-silicon nitride composite. In contrast to prior art sandwich structures, this composite link structure protects the oxide component from, rather than exposing it to, the conductive metal lines, thereby minimizing the chance of chemical reactions that could degrade the structure over time.

Moreover, the use of a single oxide component (rather than two distinct oxide layers as taught in prior art devices) allows for better control of the oxide thickness, yielding more reliable links which can be programmed consistently at a uniform voltage.

It is also preferable to deposit the various link structure components rather than resort to thermally grown oxides and the like. The oxide (and nitride layers) can be deposited by chemical vapor deposition techniques and, preferably, by plasma-enhanced chemical vapor deposition (PECVD) techniques. In particular, PECVD is a highly controllable process and permits the use of a bottom metal layer rather than polysilicon.

Moreover, deposition techniques permit control over the silicon content. In forming the link structures of the present invention, silicon-rich components will often be useful. In some applications, it will be preferable to deposit silicon-rich compositions with up to twice as much silicon as the normal ($SiO_2$ and $Si_3N_4$) stoichiometric formulae. For example, when silicon-rich compositions are desired, the oxide layers of the link compositions can be described by the formula: $SiO_x$, where x can range from about 1.5 to about 2.0, and the nitride layers can be described by the formula: $SiN_y$, where y can range from about 0.3 to about 1.3.

Once the oxide insulator (with or without protective nitride barrier coatings) is deposited, a second conductive element can be disposed above the link material and the first conductive element. This second metallization layer can be aluminum or any other low resistance conductive material. In some applications, it can be preferable to construct the upper conductive layer as a mirror image of the lower conductive layer. Thus, the link structure can be covered by a first thin layer of aluminum, silicon or other smooth conductive material, followed by a substantially thicker layer of a refractory conductive material that protects the link from thermal stresses and hillocks.

In one exemplary structure, a refractory metal conductor, approximately 0.5 micrometer in thickness, can be deposited with a thin (e.g., less than 50 nanometers) layer of aluminum laid down as an overcoating. Above this aluminum overcoating, the link composition is deposited, comprising a first nitride protective barrier, having a thickness on the order of 10 nanometers, followed by a 10 nanometer thick insulative oxide and another overlying 10 nanometer thick nitride protective barrier. Finally, the upper metallization of aluminum (or other conductive composite) can be deposited.

When the structures of the present invention are formed, conductive links can be formed by the application of a predetermined voltage, typically greater than seven volts but less than 15 volts, preferably on the order of about 7.5 to about 12.5 volts, and most preferably on the order of about 8.5 to about 10.5 volts. The application of this voltage results in localized heating and, eventually, a "percolation" phenomenon in which the oxygen in the insulator is driven off (primarily as volatile aluminum or other metallic suboxides) until the insulator is largely reduced to silicon. As the voltage continues to be applied, the overlying conductive material forms a metal-to-metal contact with the underlying metallization layer, thereby forming an electrical link in the programmed region.

It appears that the vertical columnar nature of the microcrystals which are presented by refractory materials such as molybdenum when used in the present invention may also contribute to the percolation phenomenon, and thereby help ensure the uniform threshold voltage behavior exhibited by the link structures. The projections of the individual grains serve as an array of electrical discharge points, each of which is capable of initiating a minute charge injection. The multiple discharge points, in contrast to hillocks, appear to prevent premature breakdowns from occurring.

In some instances, the present invention can also be used as not only as a programmable anti-fuse, but also one which can be deactivated (e.g., an anti-fuse/fuse combination). The link can be "erased" by further application of a high current at a low voltage, such that the metal which melts into the link region to initially form the conductive path is eventually driven back out of the region by evaporation in order to open the circuit.

The invention will be described below in connection with certain illustrated embodiments. However, it should be clear that various additions, subtractions and modifications can be made by those skilled in the art without departing from the spirit or the scope of the claims. For example, the term "aluminum" as used herein is intended to encompass not only pure aluminum but also various aluminum alloys, including AlSi, AlSiCu, AlCu, TiAl, and AlCuCr compounds and the like which are known and used routinely in the semiconductor industry.

Although the terms "first" and "second" metallization layers are used herein to distinguish between lower and upper metallization lines, it should be clear that the "first" metallization line need not be the first or lowest conductive path in the integrated circuit. Likewise, the "second" layer need not be the only other metallization layer. There may be intermediate metallization layers that do not enter into the programmable link.

Moreover, the invention can be practiced to establish links between more than two conductive layers, the terms "first" and "second" being merely shorthand expressions for the bottom and top of the conductive path, respectively.

Likewise, the term "substrate" is used herein to describe various layers which may lay below the "first" metallization layer, including the bulk silicon of the wafer, active devices (e.g. sources, gates and/or drain regions), field oxide layers, gate oxide layers, and other structures as the case may be. Finally, it should be appreciated that the link structures and methods of the present invention need not be limited to silicon-based devices, but rather can also find applications in other semiconductor devices, such as gallium arsenide structures and the like.

DETAILED DESCRIPTION

Figure 1:
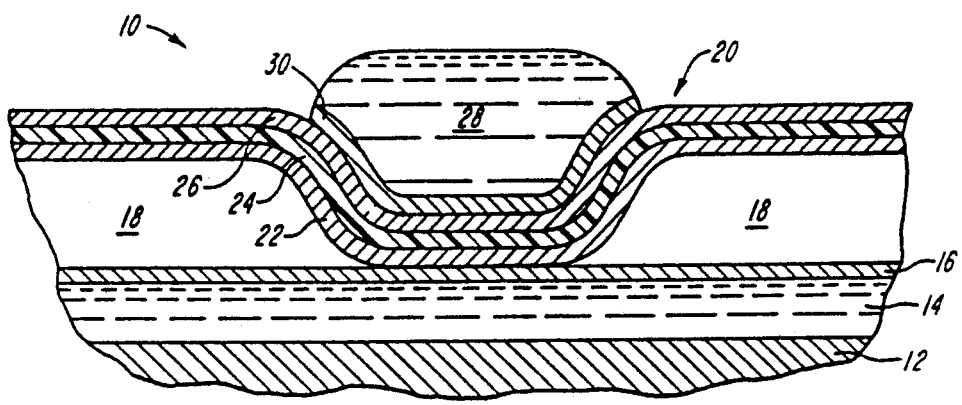
FIG. 1 is a sectional schematic view of a voltage programmable link structure according to the invention.

In FIG. 1, a programmable link structure 10 is shown formed upon a substrate 12 (which can be a field insulator or an active device layer of an integrated circuit wafer). The link 10 includes a first (lower) metalization layer 14 comprising a refractory conductive material and may further include a conductive top coating 16 of a non-refractory conductor, such as aluminum. Above this first metalization layer 14, a thick oxide insulator 18 is typically deposited in all regions, except those where a programmable link is desired. (In practice, the oxide is typically deposited uniformly over the wafer and etched away by conventional masking techniques to expose the first metalization layer 14 or the conductive top coating 16, if present.)

In the link region, a decomposable insulator 20 is then deposited as the link material into the etched via. Following deposition of the link material 20, a second (upper) metal line 28 is formed over the link (e.g., by deposition, masking and etching, or other techniques well known in the industry). The second metal 28 can be a refractory material and can further include a thin lower layer 30 of a nonrefractory conductor, such as aluminum.

In the illustrated embodiment, the decomposable insulator 20 comprises a three-part deposited sandwich consisting of a first silicon nitride layer 22, a middle silicon oxide layer 24 and upper silicon nitride layer 26. These three layers can each have thicknesses ranging from about 5 to 30 nanometers. For example, each of the three layers can be about 10 nanometers thick. The thickness of these layers may vary with particular applications, but they should be designed such that the application of a voltage from upper conductive metal layer 28 to the lower metalization layer 14 will cause the link material to become conductive.

Figure 2:
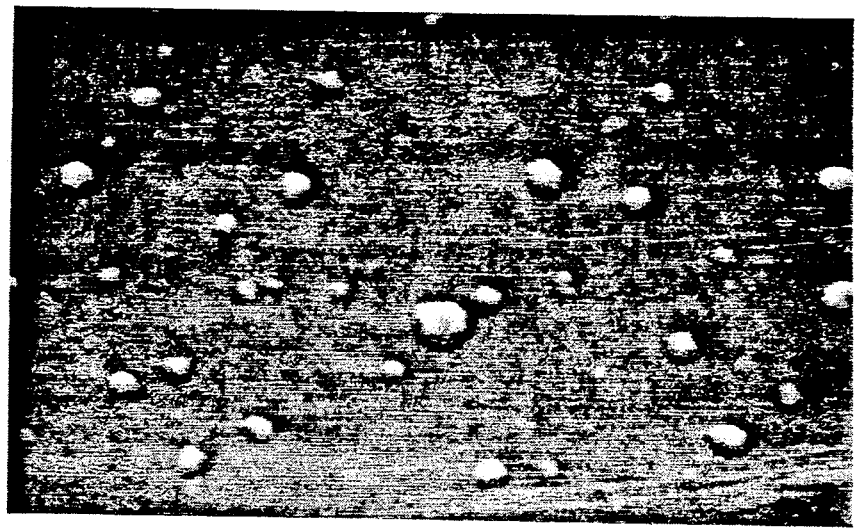
FIG. 2 is a microphotograph of an aluminum metallization layer, following common sintering treatment, showing the formation of irregular surface hillocks.

FIG. 2 is a microphotograph illustrating the typical surface irregularities found when aluminum is deposited as a first (lower) metalization layer material. As can be seen in FIG. 2, the aluminum surface exhibits a number of protrusions or "hillocks" which extend above the surface layer as much as 1 micrometer. The surface irregularities can result in microfractures of the overlying materials during wafer processing.

Figure 3:
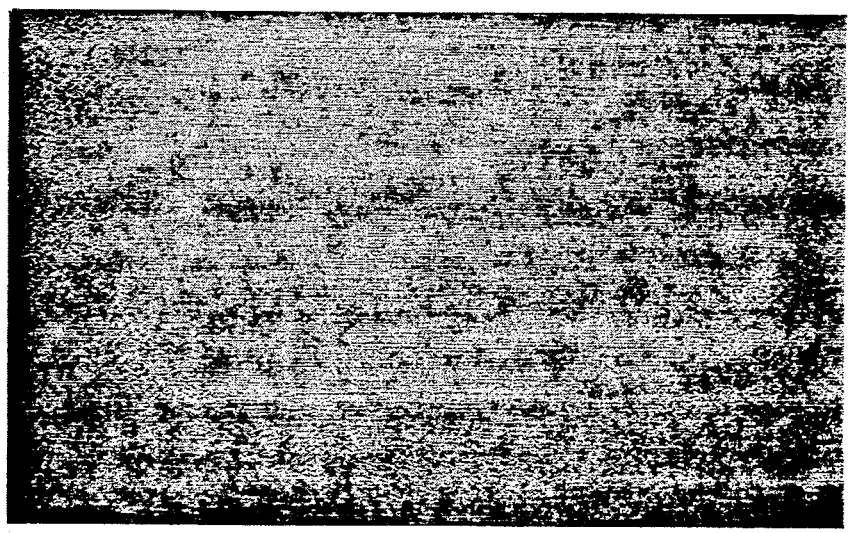
FIG. 3 is a microphotograph of an molybdenum metallization layer, again following sintering, showing the formation of a smooth surface without hillocks.

In contrast, FIG. 3 shows the surface structure of molybdenum, a material which forms columnar microcrystals which result in a highly planar surface (e.g., with protuberances no more than about 10 nanometers).

Figure 4:
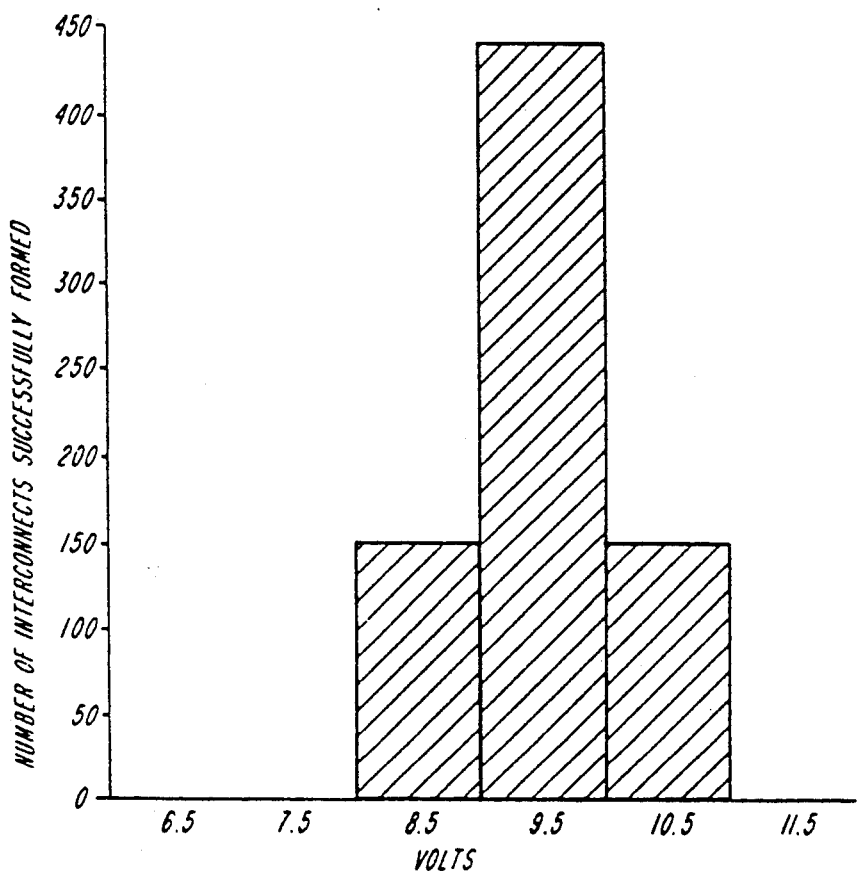
FIG. 4 is an histogram of programmable links activated by an applied voltage in accordance with the invention, showing the relative numbers of links achieved at various programming voltages.

FIG. 4 is an histogram of programmable links activated by an applied voltage in accordance with the invention, showing the relative numbers of links achieved at various programming voltages. As the results indicate, the distribution of breakdown voltages was quite narrow. A total of 742 links were activated by application of voltage in the range of about 8.5 to 10.5 volts. The link structures were nitride-oxide-nitride (10 nanometers each) sandwich structures with molybdenum as the lower conductor and aluminum as the upper conductor.

Figure 5:
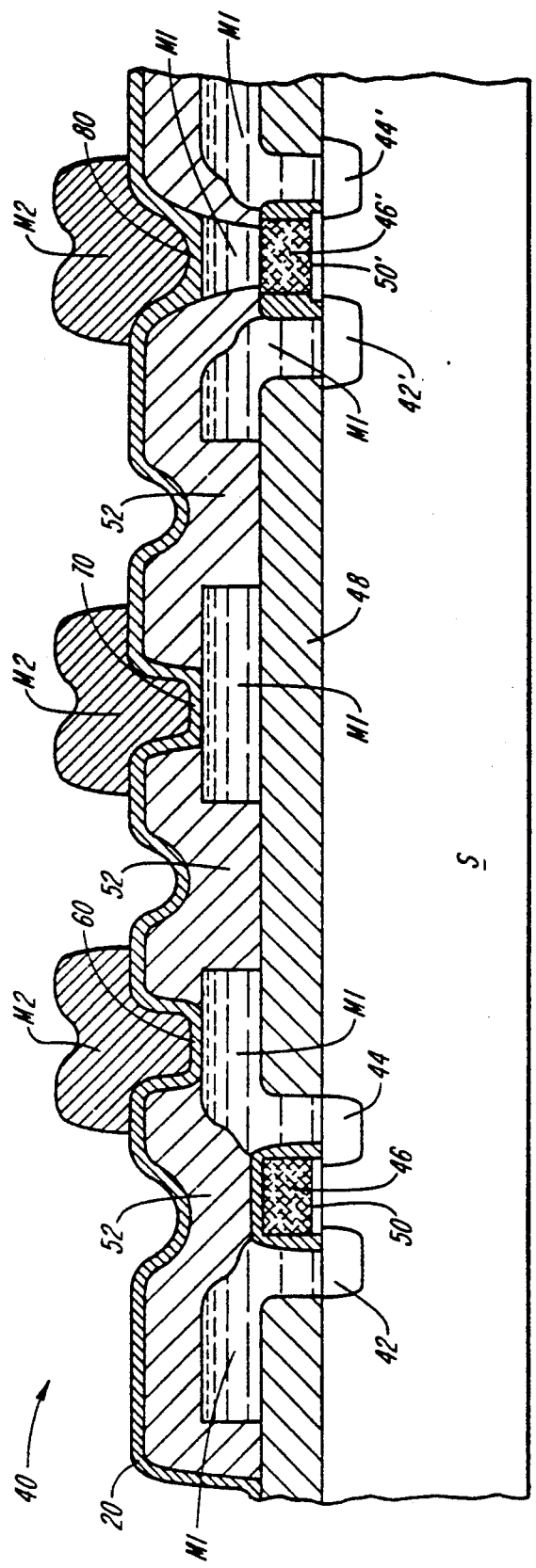
FIG. 5 is a sectional view of an integrated circuit showing a plurality of programmable link structures in accordance with the invention.

FIG. 5 is a sectional view of an integrated circuit 40 showing a plurality of programmable link structures in accordance with the invention. In circuit 40 a number of active devices are formed upon a substrate S. For example, on the left side of the illustration, a transistor 60 is shown comprising source 42, drain 44 and gate 46. The components of this active device are isolated from the other structures of the wafer by a thick oxide layer 48 (and a thinner gate oxide 50 in the vicinity of the transistor gate 46). The formation of such active devices is well known in the art. Another transistor having similar source, drain and gate elements 42', 44', and 46', respectively, is shown at the right side of FIG. 5.

First metallization layer M1 is deposited in order to interconnect various active device elements on circuit 40. For example, on the left side of the illustration, the conductor layer M1 provides electrical connections to the source 42 and drain 44. Metallization layer M1 can also provide electrical contacts with polysilicon gate region 46' as shown on the right side of the figure. In accordance with the present invention, metallization layer M1 is a refractory conductive material or composite which substantially reduces the thermal stresses and/or hillock-induced defects associated with aluminum-based structures. After the horizontal interconnect layer M1 is formed, the metal lines are then isolated by insulator layer 52 which covers the lines except in those regions where programmable links are desired.

In each of the link regions 60, 70 and 80, as shown on FIG. 5, a via is first created (e.g., by etching away portions of insulator 52) above those sites where link is to be formed with the underlying metal lines M1. Within these vias (and over other regions of insulator 52), a decomposable insulator 20 is deposited according to the present invention. The decomposable insulator 20 can comprises a three-part deposition sandwich, as described above, consisting of a first silicon nitride layer 26, a middle silicon oxide layer 24 and upper silicon nitride layer 22.

These three layers can each have thicknesses ranging from about 5 to 30 nanometers. For example, each of the three layers of the link structure 20 can be about 10 nanometers thick. Following the deposition of the link material, a second (upper) metallization layer M2 can be deposited and patterned to form another set of interconnects.

Link structure 60, as shown in FIG. 5, permits an electrically programmable link to be formed between upper metal layer M2, lower layer M1 and transistor drain 44. Similarly, link structure 70 permits the formation of a link between layers M2 and M1 (in which the M1 line is electrically connected to another device element not shown in the sectional plane of FIG. 5). Link structure 80 permits the formation of a link between M2, M1 and the gate 46' of the transistor shown on the right side of the figure. Various other arrangements of interconnects, devices and links can be appreciated by those skilled in the art.

What is claimed is:

1. An electrically programmable link structure comprising:
    a lower conductive element;
    a transformable insulator material disposed over a portion of the lower conductive element, the transformable insulator material comprising a sandwiched structure comprising a silicon oxide layer formed between silicon nitride layer; and
    an upper conductive element disposed over the insulator material, such that by applying a voltage between said upper and lower conductive elements across at least one selected region of said insulator material, the insulator material can be rendered conductive.

2. The structure of claim 1 wherein the lower conductive element comprises a refractory material having a thermal coefficient of expansion less than about $10.0 \times 10^{-6}/°C$.

3. The structure of claim 1 wherein the lower conductive element comprises a material chosen from the group consisting of refractory metals, refractory metal alloys and refractory metal silicides.

4. The structure of claim 1 wherein the lower conductive element comprises a refractory material selected from the group consisting of molybdenum, titanium and tungsten.

5. The structure of claim 4 wherein the refractory material comprises molybdenum.

6. The structure of claim 1 wherein the lower conductive element comprises an overcoating of a thin layer of a non-refractory conductive material over refractory conductive material.

7. The structure of claim 6 wherein the non-refractory conductive overcoating is aluminum.

8. The structure of claim 6 wherein the non-refractory conductive overcoating is silicon.

9. The structure of claim 1 wherein the thickness of the oxide layer ranges from about 5 to about 30 nanometers.

10. The structure of claim 1 wherein the thickness of each silicon nitride layer ranges from about 5 to about 30 nanometers.

11. The structure of claim 1 wherein the silicon nitride layer is silicon-rich.

12. The structure of claim 11 where in the nitride is a composition according to the formula $SiN_y$ where y ranges from about 0.3 to about 1.3.

13. The structure of claim 1 wherein the upper conductive element comprises aluminum.

14. The structure of claim 1 wherein the upper conductive element comprises a refractory material having a thermal coefficient of expansion less than about $10.0 \times 10^{-6}/°C$.

15. The structure of claim 1 wherein the upper conductive element comprises a material chosen from the group consisting of refractory metals, refractory metal alloys and refractory metal silicides.

16. The structure of claim 1 wherein the upper conductive element comprises a refractory material selected from the group consisting of molybdenum, titanium and tungsten.

17. The structure of claim 16 wherein the refractory material comprises molybdenum.

18. The structure of claim 1 wherein the upper conductive element comprises an undercoating of a thin layer of a non-refractory conductive material under a layer of refractory conductive material.

19. The structure of claim 18 wherein the non-refractory conductive undercoating is aluminum.

20. The structure of claim 18 wherein the non-refractory conductive undercoating is silicon.

21. The structure of claim 1 wherein the insulator material is rendered conductive with a voltage of less than 13 volts.

22. The structure of claim 21 wherein the conductive elements comprise nonrefractory material.

23. The structure of claim 21 wherein the conductive elements comprise aluminum.

24. An electrically programmable link structure comprising:
a lower conductive element;
a transformable insulator material disposed over the lower conductive element, the transformable insulator material comprising a sandwiched structure of a silicon oxide layer interposed between silicon nitride layers, the silicon oxide layer having the thickness greater than about 5 nm; and
an upper conductive element disposed over the insulator material, such that by applying over the between said upper and lower conductive elements across at least one selected region of said insulator material, the insulator material can be rendered conductive.

25. The structure of claim 24, wherein the silicon nitride and the silicon oxide layers each have a thickness ranging from about 5 nm to about 30 nm.

26. The structure of claim 24 wherein the insulator material is rendered conductive with a voltage of less than 13 volts.

27. The structure of claim 24 wherein the conductive elements comprise nonrefractory material.

28. The structure of claim 24 wherein the conductive elements comprise aluminum.

29. An electrically programmable link structure comprising:
a lower conductive element;
a transformable insulator material disposed over the lower conductive element, the transformable insulator material comprising a sandwiched structure comprising a silicon oxide layer and at least one silicon nitride layer formed by a low temperature chemical vapor deposition; and
an upper conductive element disposed over the insulator material, such that by applying a voltage between said upper and lower conductive elements across at least one selected region of said insulator material, the insulator material can be rendered conductive, wherein the transformable insulator material comprises the silicon oxide layer interposed between silicon nitride layers.

30. A structure of claim 29 wherein the insulator material is rendered conductive with a voltage of less than 13 volts.

31. A structure of claim 29 wherein the conductive elements comprise nonrefractory material.

32. A structure of claim 29 wherein the conductive elements comprise aluminum.

33. An electrically programmable link structure comprising:
a lower conductive element;
a transformable insulator material disposed over the lower conductive element, the transformable insulator material comprising a silicon oxide layer having a thickness greater than 5 nm and at least one barrier layer; and
an upper conductive element disposed over the insulator material, such that by applying a voltage between the upper and lower conductive elements across at least one selected region of the insulator material, the insulator material is rendered conductive, wherein the silicon oxide layer is interposed between silicon nitride barrier layers.

34. A structure of claim 33 wherein the insulator material is rendered conductive with a voltage of less than 13 volts.

35. A structure of claim 33 wherein the conductive elements comprise nonrefractory material.

36. An electrically programmable link structure comprising:
a lower conductive element comprising aluminum;
a transformable insulator material disposed over a portion of the lower conductive element, the transformable insulator material comprising a sandwich structure comprising a silicon oxide layer formed between silicon nitride layers through a low temperature deposition process, the oxide layer being of low quality and of a thickness greater than 5 nm; and
an upper conductive element comprising aluminum disposed over the insulator material, such that by applying a voltage of less than 13 volts between said upper and lower conductive elements across at least one selected region of said insulator material, the insulator material is rendered conductive.

* * * * *

UNITED STATES PATENT AND TRADEMARK OFFICE
CERTIFICATE OF CORRECTION

PATENT NO. : 5,258,643
DATED : November 2, 1993
INVENTOR(S) : Simon S. Cohen

It is certified that error appears in the above-indentified patent and that said Letters Patent is hereby corrected as shown below:

In Claim 1, column 8, line 54, change "layer" to --layers--.

In Claim 24, column 9, line 61, change "having the" to --having a--; and in line 64, change "by applying over the between" to --by applying a voltage between--.

Signed and Sealed this

Twenty-sixth Day of April, 1994

Attest:

BRUCE LEHMAN

*Attesting Officer*    *Commissioner of Patents and Trademarks*